(12) United States Patent
Fujimoto et al.

(10) Patent No.: US 12,327,975 B2
(45) Date of Patent: Jun. 10, 2025

(54) CHAMBER DEVICE, AND ELECTRONIC DEVICE MANUFACTURING METHOD

(71) Applicant: Gigaphoton Inc., Tochigi (JP)

(72) Inventors: Junichi Fujimoto, Oyama (JP); Takahiro Tatsumi, Oyama (JP); Kazuki Nagai, Oyama (JP); Jeffrey P. Sercel, Manchester, NH (US)

(73) Assignee: Gigaphoton Inc., Tochigi (JP)

( * ) Notice: Subject to any disclaimer, the term of this patent is extended or adjusted under 35 U.S.C. 154(b) by 173 days.

(21) Appl. No.: 18/447,514

(22) Filed: Aug. 10, 2023

(65) Prior Publication Data

US 2023/0387641 A1 Nov. 30, 2023

Related U.S. Application Data

(63) Continuation of application No. PCT/JP2022/003118, filed on Jan. 27, 2022.

(60) Provisional application No. 63/165,576, filed on Mar. 24, 2021.

(51) Int. Cl.
| | | |
|---|---|---|
| *H01S 3/03* | (2006.01) | |
| *G03F 7/00* | (2006.01) | |
| *H01S 3/04* | (2006.01) | |
| *H01S 3/041* | (2006.01) | |

(52) U.S. Cl.
CPC ............ *H01S 3/03* (2013.01); *G03F 7/70025* (2013.01); *G03F 7/70891* (2013.01); *H01S 3/0405* (2013.01); *H01S 3/0407* (2013.01); *H01S 3/041* (2013.01)

(58) Field of Classification Search
CPC .... G03F 7/20; G03F 7/70025; G03F 7/70891; H01S 3/03; H01S 3/036; H01S 3/0405; H01S 3/0407; H01S 3/041; H01S 3/09713; H01S 3/225
See application file for complete search history.

(56) References Cited

U.S. PATENT DOCUMENTS

| | | | |
|---|---|---|---|
| 6,597,719 B1 * | 7/2003 | Nara | ........................ H01S 3/036 |
| | | | 372/55 |
| 2011/0274132 A1 | 11/2011 | Funaoka et al. | |
| 2015/0333468 A1 | 11/2015 | Liu et al. | |
| 2017/0131129 A1 | 5/2017 | Ahr et al. | |

(Continued)

FOREIGN PATENT DOCUMENTS

| | | |
|---|---|---|
| JP | 2002 176220 A | 6/2002 |
| JP | 2004-111765 A | 4/2004 |

(Continued)

OTHER PUBLICATIONS

International Search Report issued in PCT/JP2022/003118; mailed Mar. 29, 2022.

(Continued)

*Primary Examiner* — Peter B Kim
(74) *Attorney, Agent, or Firm* — Studebaker Brackett PLLC

(57) ABSTRACT

A chamber device includes an inner housing including a passage port through which light generated by excitation of laser gas at an internal space thereof passes, an outer housing surrounding at least a part of the inner housing from a lateral side of a travel direction of the light, and a partition wall arranged between the inner housing and the outer housing and fixed to the inner housing and the outer housing.

20 Claims, 7 Drawing Sheets

(56) References Cited

U.S. PATENT DOCUMENTS

2017/0346252 A1   11/2017   Katsuumi et al.
2024/0399510 A1*  12/2024   Tatsumi ................. H01S 3/041

FOREIGN PATENT DOCUMENTS

| JP | 2015-537386 A | 12/2015 |
| JP | 2019 501410 A | 1/2019 |
| JP | 2019 134122 A | 8/2019 |
| WO | 03/021729 A1 | 3/2003 |
| WO | 2010/134166 A1 | 11/2010 |
| WO | 2016/143105 A1 | 9/2016 |

OTHER PUBLICATIONS

Written Opinion issued in PCT/JP2022/003118; mailed Mar. 29, 2022.

* cited by examiner

CHAMBER DEVICE, AND ELECTRONIC DEVICE MANUFACTURING METHOD

CROSS-REFERENCE TO RELATED APPLICATIONS

The present application claims the benefit of International Application No. PCT/JP2022/003118, filed on Jan. 27, 2022, the entire contents of which are hereby incorporated by reference.

BACKGROUND

1. Technical Field

The present disclosure relates to a chamber device and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser device for exposure, a KrF excimer laser device for outputting laser light having a wavelength of about 248 nm and an ArF excimer laser device for outputting laser light having a wavelength of about 193 nm are used.

The KrF excimer laser device and the ArF excimer laser device each have a large spectrum line width of about 350 pm to 400 pm in natural oscillation light. Therefore, when a projection lens is formed of a material that transmits ultraviolet rays such as KrF laser light and ArF laser light, there is a case in which chromatic aberration occurs. As a result, the resolution may decrease. Then, a spectrum line width of laser light output from the gas laser device needs to be narrowed to the extent that the chromatic aberration can be ignored. For this purpose, there is a case in which a line narrowing module (LNM) including a line narrowing element (etalon, grating, and the like) is provided in a laser resonator of the gas laser device to narrow a spectrum line width. In the following, a gas laser device with a narrowed spectrum line width is referred to as a line narrowing gas laser device.

LIST OF DOCUMENTS

Patent Documents

Patent Document 1: Japanese Patent Application Publication No. 2002-176220

SUMMARY

A chamber device according to an aspect of the present disclosure includes an inner housing including a passage port through which light generated by excitation of laser gas at an internal space thereof passes, an outer housing surrounding at least a part of the inner housing from a lateral side of a travel direction of the light, and a partition wall arranged between the inner housing and the outer housing and fixed to the inner housing and the outer housing.

An electronic device manufacturing method according to an aspect of the present disclosure includes generating laser light using a gas laser device including a chamber device, outputting the laser light to an exposure apparatus, and exposing a photosensitive substrate to the laser light in the exposure apparatus to manufacture an electronic device. Here, the chamber device includes an inner housing including a passage port through which light generated by excitation of laser gas at an internal space thereof passes, an outer housing surrounding at least a part of the inner housing from a lateral side of a travel direction of the light, and a partition wall arranged between the inner housing and the outer housing and fixed to the inner housing and the outer housing.

BRIEF DESCRIPTION OF THE DRAWINGS

An embodiment of the present disclosure will be described below merely as examples with reference to the accompanying drawings.

DESCRIPTION OF EMBODIMENTS

Figure 1:
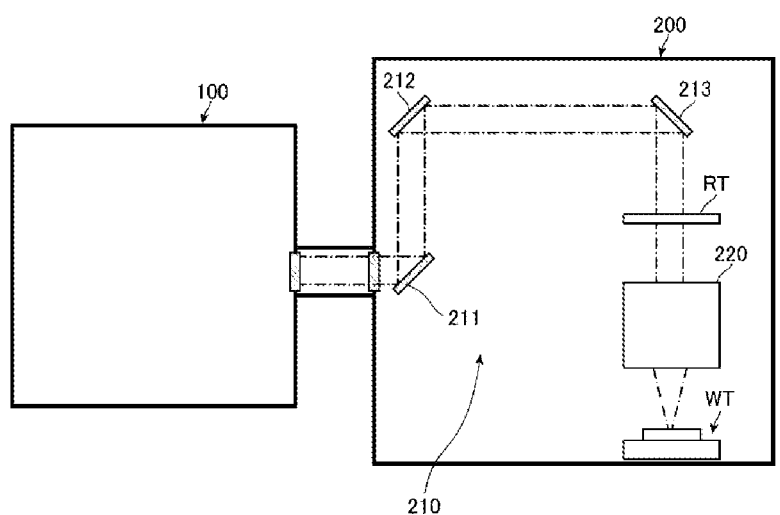
FIG. 1 is a schematic view showing a schematic configuration example of an entire electronic device manufacturing apparatus.

1. Description of electronic device manufacturing apparatus used in exposure process of electronic device
2. Description of gas laser device of comparative example
   2.1 Configuration
   2.2 Operation
   2.3 Problem
3. Description of chamber device of embodiment
   3.1 Configuration
   3.2 Effect Hereinafter, an embodiment of the present disclosure will be described in detail with reference to the drawings. The embodiment described below shows some examples of the present disclosure and does not limit the contents of the present disclosure. Also, all configurations and operation described in the embodiment are not necessarily essential as configurations and operation of the present disclosure. Here, the same components are denoted by the same reference numeral, and duplicate description thereof is omitted.

1. Description of Electronic Device Manufacturing Apparatus used in Exposure Process of Electronic Device FIG. 1 is a schematic view showing a schematic configuration example of an entire electronic device manufacturing apparatus used in an exposure process of an electronic device. As shown in FIG. 1, the manufacturing apparatus used in the exposure process includes a gas laser device 100 and an exposure apparatus 200. The exposure apparatus 200 includes an illumination optical system 210 including a plurality of mirrors 211, 212, 213 and a projection optical system 220. The illumination optical system 210 illuminates a reticle pattern of a reticle stage RT with laser light incident from the gas laser device 100. The projection optical system 220 causes the laser light transmitted through the reticle to be imaged as being reduced and projected on a workpiece (not shown) arranged on a workpiece table WT. The workpiece is a photosensitive substrate such as a semiconductor wafer on which photoresist is applied. The exposure apparatus 200 synchronously translates the reticle stage RT and the workpiece table WT to expose the workpiece to the laser light reflecting the reticle pattern. Through the exposure process as described above, a device pattern is transferred onto the semiconductor wafer, thereby a semiconductor device, which is the electronic device, can be manufactured.

2. Description of Gas Laser Device of Comparative Example 2.1 Configuration

The gas laser device 100 of a comparative example will be described. The comparative example of the present disclosure is an example recognized by the applicant as known only by the applicant, and is not a publicly known example admitted by the applicant.

Figure 2:
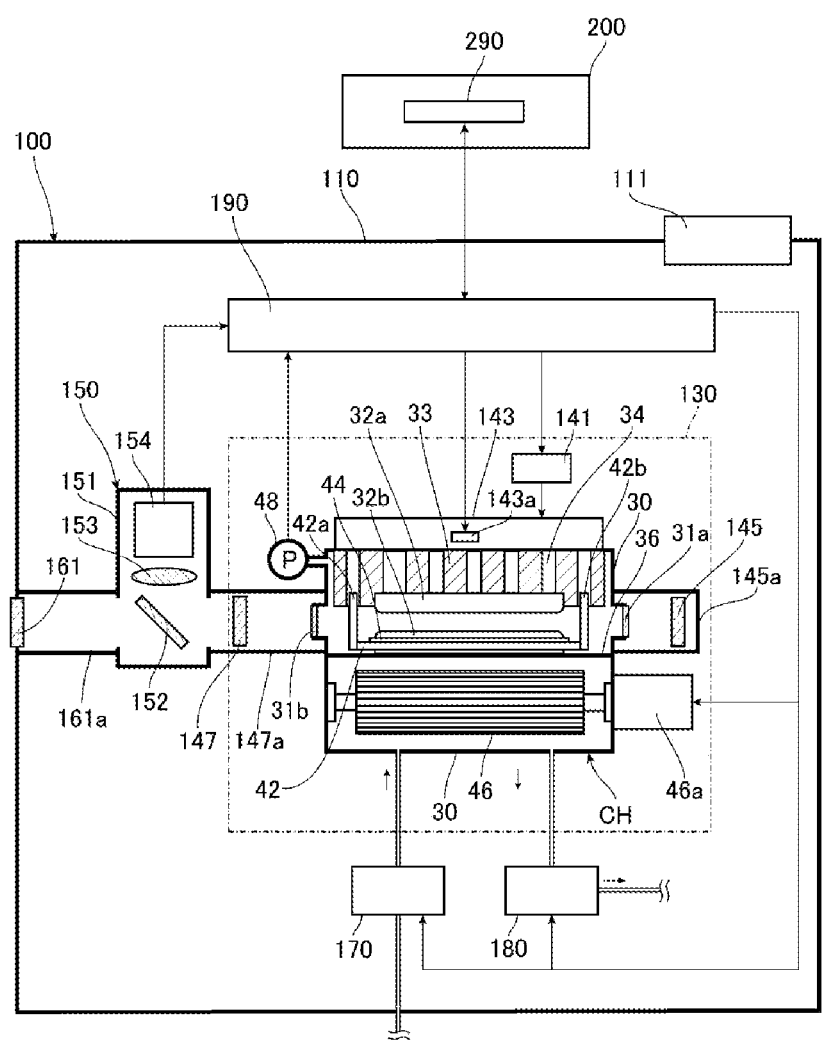
FIG. 2 is a schematic view showing a schematic configuration example of an entire gas laser device of a comparative example.

FIG. 2 is a schematic view showing a schematic configuration example of the entire gas laser device 100 of the present example. The gas laser device 100 is, for example, an ArF excimer laser device using a mixed gas including argon (Ar), fluorine ($F_2$), and neon (Ne). In this case, the gas laser device 100 outputs pulse laser light having a center wavelength of about 193 nm. The gas laser device 100 may be a gas laser device other than the ArF excimer laser device, and may be, for example, a KrF excimer laser device using a mixed gas including krypton (Kr), $F_2$, and Ne. In this case, the gas laser device 100 outputs pulse laser light having a center wavelength of about 248 nm. The mixed gas containing Ar, $F_2$, and Ne being a laser medium and the mixed gas containing Kr, $F_2$, and Ne being a laser medium may each be referred to as a laser gas. In the mixed gas used in each of the ArF excimer laser device and the KrF excimer laser device, helium (He) may be used instead of Ne.

The gas laser device 100 of the present example includes a housing 110, a laser oscillator 130 arranged at the internal space of the housing 110, a monitor module 150, a laser gas supply device 170, a laser gas exhaust device 180, and a laser processor 190 as a main configuration.

The laser oscillator 130 includes a chamber device CH, a charger 141, a pulse power module 143, a rear mirror 145, and an output coupling mirror 147 as a main configuration.

Figure 3:
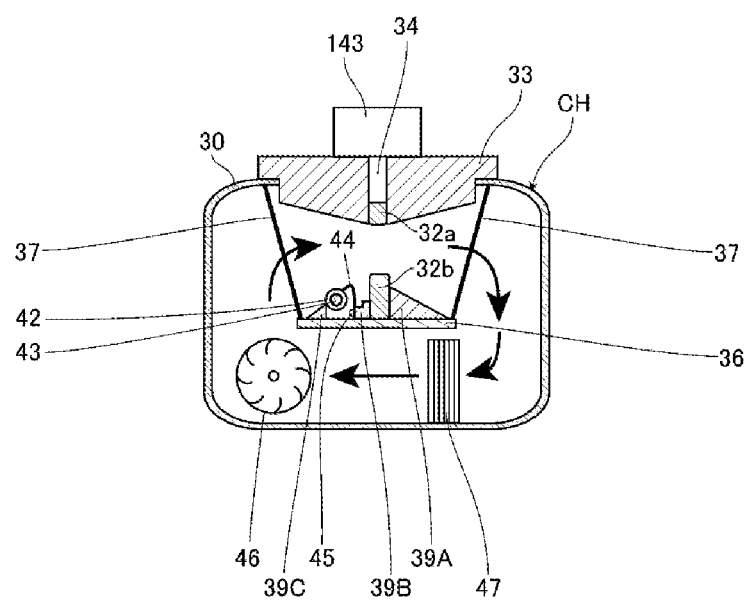
FIG. 3 is a sectional view, perpendicular to the travel direction of laser light, of a chamber device shown in FIG. 2.

In FIG. 2, the internal configuration of the chamber device CH is shown as viewed from a direction substantially perpendicular to the travel direction of the laser light. Further, FIG. 3 is a sectional view, perpendicular to the travel direction of the laser light, of the chamber device CH shown in FIG. 2. The chamber device CH includes a housing 30, windows 31*a*, 31*b*, electrodes 32*a*, 32*b*, an insulating portion 33, an electrode holder portion 36, guides 39A, 39B, 39C, a dielectric pipe 42, an inner electrode 43, an outer electrode 44, a cross flow fan 46, a heat exchanger 47, and a pressure sensor 48 as a main configuration.

As shown in FIG. 2, the housing 30 includes an internal space in which light is generated by excitation of the laser gas. The laser gas is supplied from the laser gas supply device 170 to the internal space of the housing 30 through a pipe. The above-described light generated by excitation of the laser gas travels to the windows 31*a*, 31*b*.

The window 31*a* is located on one end side in the travel direction of the laser light in the housing 30, and the window 31*b* is located on the other end side in the travel direction of the laser light in the housing 30. The windows 31*a*, 31*b* are inclined at the Brewster angle with respect to the travel direction of the laser light so that P-polarized light of the laser light is suppressed from being reflected. The window 31*a* is fitted to a hole of the housing 30, and the window 31*b* is fitted to a hole on the opposite side to the above hole on the window 31*a* side.

The longitudinal direction of the electrodes 32*a*, 32*b* is along the travel direction of the laser light, and the electrodes 32*a*, 32*b* are arranged to face each other at the internal space of the housing 30. The space between the electrode 32*a* and the electrode 32*b* in the housing 30 is sandwiched between the window 31*a* and the window 31*b*. The electrodes 32*a*, 32*b* are main discharge electrodes for exciting the laser medium by glow discharge. In the present example, the electrode 32*a* is the cathode and the electrode 32*b* is the anode.

As shown in FIG. 3, the electrode 32*a* is supported by the insulating portion 33. The insulating portion 33 blocks an opening continued to the housing 30. The insulating portion 33 includes an insulator. Examples of the insulator include alumina ceramics having low reactivity with an $F_2$ gas. The cross-section of the part, supporting the electrode 32*a*, of the insulating portion 33 is narrowed toward the electrode 32*b* facing the electrode 32*a*. Accordingly, the insulating portion 33 guides the laser gas such that the laser gas in the housing 30 flows between the electrode 32*a* and the electrode 32*b* from the cross flow fan 46 side due to blowing by the cross flow fan 46. In FIG. 3, the flow of the laser gas at the internal space of the housing 30 is indicated by thick arrows. The laser gas circulates through the cross flow fan 46, a space between the electrode 32*a* and the electrode 32*b*, the heat exchanger 47, and the cross flow fan 46 in this order. Further, a feedthrough 34 made of a conductive member is embedded in the insulating portion 33. The feedthrough 34 applies a voltage supplied from the pulse power module 143 to the electrode 32*a*.

The electrode 32*b* is supported by the electrode holder portion 36 and is electrically connected to the electrode holder portion 36. The electrode holder portion 36 is electrically connected to the housing 30 via a wiring 37. The guides 39A, 39B, 39C are provided on the electrode holder portion 36. Examples of the material of each of the guides 39A, 39B, 39C include porous nickel metal, which has low reactivity with an $F_2$ gas. The electrode 32*b* is sandwiched between the guide 39A and the guide 39B and fixed on the electrode holder portion 36.

The dielectric pipe 42, the inner electrode 43, and the outer electrode 44 are arranged along the travel direction of the laser light. The dielectric pipe 42 has, for example, a cylindrical shape. The dielectric pipe 42 is made of, for example, a dielectric material such as aluminum oxide. The inner electrode 43 has a rod shape and is arranged along the dielectric pipe 42 in a through hole of the dielectric pipe 42. As shown in FIG. 2, fixed pipes 42*a*, 42*b* are connected to both ends of the dielectric pipe 42. A wiring (not shown) connected to one end of the inner electrode 43 is arranged in a through hole of one fixed pipe 42*a*. Further, a wiring (not shown) connected to the other end of the inner electrode 43 is arranged in a through hole of the other fixed pipe 42*b*. These wirings are each connected to the feedthrough 34. Therefore, the feedthrough 34 applies the voltage supplied from the pulse power module 143 to the inner electrode 43 as described above.

One end of the outer electrode 44 is in contact with a part of the outer peripheral surface of the dielectric pipe 42. The other end of the outer electrode 44 is electrically connected to the electrode holder portion 36. Therefore, the outer electrode 44 is electrically connected to the electrode 32b via the electrode holder portion 36, and is electrically connected to the housing 30 via the electrode holder portion 36 and the wiring 37. The outer electrode 44 is bent between the one end and the other end, and the bent part is bent in an in-plane direction perpendicular to the longitudinal direction of the dielectric pipe 42. Further, due to the bending, the one end of the outer electrode 44 is in contact with the outer peripheral surface of the dielectric pipe 42 so as to push the outer peripheral surface of the dielectric pipe 42. The outer electrode 44 is made of, for example, brass.

A screw hole (not shown) is provided at the other end of the outer electrode 44, and the outer electrode 44 is fixed to the guide 39B by a screw 45 screwed into the screw hole. In this state, the one end of the outer electrode 44 is pressed against and in contact with the outer peripheral surface of the dielectric pipe 42. A part, of the outer peripheral surface of the dielectric pipe 42, that is substantially opposite to a contact portion where the one end of the outer electrode 44 contacts is in contact with the guide 39C. Therefore, even when the outer electrode 44 presses the dielectric pipe 42, the dielectric pipe 42 is supported by the guide 39C.

The inner electrode 43 and the outer electrode 44 face each other with the dielectric pipe 42 interposed therebetween. When a high voltage is applied from the pulse power module 143 to the inner electrode 43 and the outer electrode 44, corona discharge occurs in the vicinity of the dielectric pipe 42 and the outer electrode 44. The corona discharge assists glow discharge which occurs between the electrodes 32a, 32b. Thus, the inner electrode 43 and the outer electrode 44 are preionization electrodes that assist the glow discharge to be caused by the electrodes 32a, 32b.

The cross flow fan 46 is arranged at the internal space of the housing 30 on the side opposite to the electrode 32b side with respect to the electrode holder portion 36. At the internal space of the housing 30, the space at which the cross flow fan 46 is arranged is in communication with the space between the electrodes 32a, 32b. Therefore, when the cross flow fan 46 rotates, the laser gas filled in the internal space of the housing 30 circulates in a predetermined direction as indicated by bold arrows in FIG. 3. The cross flow fan 46 is connected to a motor 46a arranged outside the housing 30. When the motor 46a rotates, the cross flow fan 46 rotates. ON/OFF and the number of revolution of the motor 46a are adjusted by the control of the laser processor 190. Accordingly, the laser processor 190 can adjust the circulation speed of the laser gas circulating through the internal space of the housing 30 by controlling the motor 46a.

The heat exchanger 47 is arranged beside the cross flow fan 46. At least a part of the laser gas circulating with the blowing of the cross flow fan 46 passes through the heat exchanger 47, and the temperature of the laser gas is adjusted by the heat exchanger 47.

Referring back to FIG. 2, the gas laser device 100 of the present example will be described. The charger 141 is a DC power source device that charges a capacitor (not shown) provided in the pulse power module 143 with a predetermined voltage. The charger 141 is arranged outside the housing 30 and is connected to the pulse power module 143. The pulse power module 143 includes a switch 143a controlled by the laser processor 190. When the switch 143a is turned ON from OFF by the control of the laser processor 190, the pulse power module 143 boosts the voltage applied from the charger 141 to generate a pulse high voltage, and applies the high voltage to the electrodes 32a, 32b. When the high voltage is applied, the insulation between the electrode 32a and the electrode 32b is broken, and discharge occurs. The laser medium in the housing 30 is excited by the energy of the discharge and shifts to a high energy level. When the excited laser medium then shifts to a low energy level, light corresponding to the difference between the energy levels is emitted. The emitted light travels to the windows 31a, 31b.

The rear mirror 145 faces the window 31a, and the output coupling mirror 147 faces the window 31b. The rear mirror 145 is coated with a high reflection film, and the output coupling mirror 147 is coated with a partial reflection film. The rear mirror 145 reflects the laser light output from the window 31a at high reflectance and returns the laser light to the housing 30. The output coupling mirror 147 transmits a part of the laser light output from the window 31b, and reflects another part of the laser light to return to the internal space of the housing 30 through the window 31b. The output coupling mirror 147 includes, for example, an element in which a dielectric multilayer film is formed on a substrate of calcium fluoride.

Therefore, the rear mirror 145 and the output coupling mirror 147 configure a Fabry-Perot laser resonator, and the housing 30 is arranged on the optical path of the laser resonator. The laser light output from the housing 30 reciprocates between the rear mirror 145 and the output coupling mirror 147. The reciprocating laser light is amplified every time the laser light passes through a laser gain space between the electrode 32a and the electrode 32b. A part of the amplified light passes through the output coupling mirror 147 as pulse laser light.

The rear mirror 145 is fixed to the internal space of the housing 145a connected to the one end side of the housing via a damper (not shown). Further, the output coupling mirror 147 is fixed at the internal space of the optical path pipe 147a connected to the other end side of the housing via a damper (not shown).

The monitor module 150 is arranged on the optical path of the pulse laser light transmitted through the output coupling mirror 147. The monitor module 150 includes a housing 151, a beam splitter 152, a light concentrating lens 153, and an optical sensor 154 as a main configuration. An opening is continuously formed in the housing 151, and an optical path pipe 147a is connected to surround the opening. Therefore, the internal space of the housing 151 communicates with the internal space of the optical path pipe 147a through the opening. The beam splitter 152, the light concentrating lens 153, and the optical sensor 154 are arranged at the internal space of the housing 151.

The beam splitter 152 transmits the pulse laser light transmitted through the output coupling mirror 147 to the output window 161 with high transmittance, and reflects a part of the pulse laser light toward the light concentrating lens 153. The light concentrating lens 153 concentrates the pulse laser light on the light receiving surface of the optical sensor 154. The optical sensor 154 measures a pulse energy E, which is an actual measurement value of the pulse energy of the pulse laser light incident on the light receiving surface. The optical sensor 154 is electrically connected to the laser processor 190, and outputs a signal indicating the measured pulse energy E to the laser processor 190.

An opening is continuously formed in the housing 151 of the monitor module 150 on the side opposite to the side to which the optical path pipe 147a is connected, and an optical path pipe 161a is connected to surround the opening. Thus, the internal space of the housing 151 and the internal space of the optical path pipe 161a communicate with each other. Further, the optical path pipe 161a is connected to the housing 110. An output window 161 is provided at a position surrounded by the optical path pipe 161a in the housing 110. Light transmitted through the beam splitter 152 of the monitor module 150 is output from the output window 161 to the exposure apparatus 200 outside the housing 110.

The internal space of the optical path pipes 147a, 161a and the housings 145a, 151 are filled with a purge gas. The purge gas includes an inert gas such as high-purity nitrogen containing a small amount of impurities such as oxygen. The purge gas is supplied from a purge gas supply source (not shown) arranged outside the housing 110 to the optical path pipes 147a, 161a and the internal space of the housings 145a, 151 through a pipe (not shown).

The pressure sensor 48 measures the pressure at the internal space of the housing 30. The pressure sensor 48 is electrically connected to the laser processor 190 and outputs a signal indicating the measured pressure to the laser processor 190.

The laser gas supply device 170 is supplied with the laser gas from a laser gas supply source (not shown) arranged outside the housing 110 through a pipe. The laser gas supply device 170 is provided with a valve (not shown) and a flow rate adjustment valve (not shown), and is connected to another pipe connected to the housing 30. In accordance with a control signal from the laser processor 190, the laser gas supply device 170 mixes a plurality of gases at a desired composition ratio to form the laser gas, and supplies the laser gas to the internal space of the housing 30 through the other pipe.

A pipe connected to the housing 30 is connected to the laser gas exhaust device 180. The laser gas exhaust device 180 includes an exhaust pump (not shown), and exhausts the gas at the internal space of the housing 30 to the internal space of the housing 110 through the pipe by the exhaust pump. In accordance with a control signal from the laser processor 190, at this time, the laser gas exhaust device 180 adjusts the exhaust amount and the like, and performs predetermined treatment on the gas exhausted from the internal space of the housing 30.

Further, the housing 110 is provided with an exhaust duct 111. The gas is exhausted from the exhaust duct 111 to the outside of the housing 110. The gas is a gas exhausted from the internal space of the housing 30 to the internal space of the housing 110 by the laser gas exhaust device 180, and a gas exhausted from the inside of the optical path pipes 147a, 161a and the like to the internal space of the housing 110 by an unillustrated configuration.

The laser processor 190 of the present disclosure is a processing device including a storage device in which a control program is stored and a CPU which executes the control program. The laser processor 190 is specifically configured or programmed to perform various processes included in the present disclosure. The laser processor 190 controls the entire gas laser device 100. The laser processor 190 is electrically connected to an exposure processor 290 of the exposure apparatus 200, and transmits and receives various signals to and from the exposure processor 290.

2.2 Operation

Next, operation of the gas laser device 100 of the comparative example will be described.

Before the gas laser device 100 outputs the pulse laser light, the internal space of the optical path pipes 147a, 161a and the internal space of the housings 145a, 151 are filled with the purge gas from the purge gas supply source (not shown). Further, the laser gas is supplied from the laser gas supply device 170 to the internal space of the housing 30. When the laser gas is supplied, the laser processor 190 controls the motor 46a to rotate the cross flow fan 46. By the rotation of the cross flow fan 46, the laser gas circulates through the internal space of the housing 30.

Before the gas laser device 100 outputs the pulse laser light, the laser processor 190 receives a signal indicating a target pulse energy Et and a light emission trigger signal from the exposure processor 290. The target pulse energy Et is a target value of the pulse energy used in the exposure process. The laser processor 190 sets a predetermined charge voltage Vhv in the charger 141 so that the pulse energy becomes the target pulse energy Et, and turns on the switch 143a in synchronization with the emission trigger signal. Thus, the pulse power module 143 generates a pulse high voltage from the electric energy held in the charger 141, and applies the high voltage between the electrode 32a and the electrode 32b and between the inner electrode 43 and the outer electrode 44. Here, the timing at which the high voltage is applied between the inner electrode 43 and the outer electrode 44 is slightly earlier than the timing at which the high voltage is applied between the electrode 32a and the electrode 32b. When the high voltage is applied between the inner electrode 43 and the outer electrode 44, corona discharge occurs in the vicinity of the dielectric pipe 42, and ultraviolet light is emitted. Further, when the laser gas between the electrode 32a and the electrode 32b is irradiated with the ultraviolet light, the laser gas between the electrode 32a and the electrode 32b undergoes preionization. After the preionization, when the high voltage is applied between the electrode 32a and the electrode 32b, insulation between the electrode 32a and the electrode 32b is broken and discharge occurs. An acoustic wave is generated by the discharge, and the acoustic wave is absorbed by the guides 39A, 39B, 39C. The reflection of an ultrasonic wave on the guides 39A, 39B, 39C is suppressed by the absorption, and propagation of the acoustic wave toward the space between the electrode 32a and the electrode 32b is suppressed. As a result, unstable discharge is suppressed, and a decrease in the stability of the energy of the light output from the gas laser device 100 is suppressed.

Further, when discharge occurs as described above, the laser medium contained in the laser gas between the electrode 32a and the electrode 32b is brought into an excited state by the energy of the discharge, and emits spontaneous emission light when returning to the ground state. Part of this light is ultraviolet rays and is transmitted through the window 31a. The transmitted light is reflected by the rear mirror 145. The light reflected by the rear mirror 145 propagates again from the window 31a to the internal space of the housing 30. The light propagating to the internal space of the housing 30 causes stimulated emission of the laser medium in the excited state, and the light is amplified. The light is transmitted through the window 31b and travels to the output coupling mirror 147. Part of the light is transmitted through the output coupling mirror 147, and the remaining part is reflected by the output coupling mirror 147, is transmitted through the window 31b, and propagates to the internal space of the housing 30. The light propagating to the internal space of the housing 30 travels to the rear mirror 145 as described above. Thus, light having a predetermined wavelength reciprocates between the rear mirror 145 and the output coupling mirror 147. The light is amplified every time the light passes through the discharge space at the internal space of the housing 30, and laser oscillation occurs. Then, part of the laser light is transmitted through the output coupling mirror 147 as pulse laser light and travels to the beam splitter 152.

Part of the pulse laser light having traveled to the beam splitter 152 is reflected by the beam splitter 152. The reflected pulse laser light is received by the optical sensor 154, and the optical sensor 154 measures the pulse energy E of the received pulse laser light. The optical sensor 154 outputs the signal indicating the measured pulse energy E to the laser processor 190. The laser processor 190 performs feedback control on the charge voltage Vhv of the charger 141 so that a difference ΔE between the pulse energy E and the target pulse energy Et is within an allowable range. When the difference ΔE is within the allowable range, the pulse laser light is transmitted through the beam splitter 152 and the output window 161 and enters the exposure apparatus 200. The pulse laser light is ArF laser light, which is an ultraviolet ray having a center wavelength of about 193 nm.

The pressure at the internal space of the housing 30 is measured by the pressure sensor 48, and the signal indicating the pressure is input from the pressure sensor 48 to the laser processor 190. When the charge voltage Vhv is more than a maximum value of an allowable range, the laser processor 190 controls the laser gas supply device 170 based on the signal from the pressure sensor 48, and supplies the laser gas to the internal space of the housing 30 until the pressure at the internal space of the housing 30 becomes a predetermined pressure. When the charge voltage Vhv is less than a minimum value of the allowable range, the laser processor 190 controls the laser gas exhaust device 180 based on the signal, and exhausts the laser gas from the internal space of the housing 30 until the pressure becomes a predetermined pressure.

2.3 Problem

In the chamber device CH of the comparative example, when light is generated by excitation of the laser gas, the temperature at the internal space of the housing 30 may increase. When the temperature increases, deviation of the temperature distribution at the internal space may occur. Further, when the laser gas is supplied from the laser gas supply device 170 to the internal space of the housing 30, the pressure at the internal space increases. The housing 30 may be deformed due to thermal expansion of the housing 30 caused by the temperature increase, the difference in thermal expansion at the internal space of the housing 30 caused by the deviation of the temperature distribution, and the increase in the pressure. When the housing 30 is deformed, the travel direction of the laser light output from the housing 30 may change from a previously assumed travel direction. Due to this change, the travel direction of the laser light output from the gas laser device 100 toward the exposure apparatus 200 may also change from a previously assumed travel direction. Therefore, the reliability of the gas laser device 100 may be reduced.

Therefore, an embodiment in the following exemplifies the chamber device CH in which a decrease in reliability of the gas laser device 100 can be suppressed.

3. Description of Chamber Device of Embodiment

Next, the chamber device CH of the embodiment will be described. Any component same as that described above is denoted by an identical reference sign, and duplicate description thereof is omitted unless specific description is needed. Further, in some drawings, a part of a member may be omitted or simplified for easy viewing.

3.1 Configuration

Figure 4:
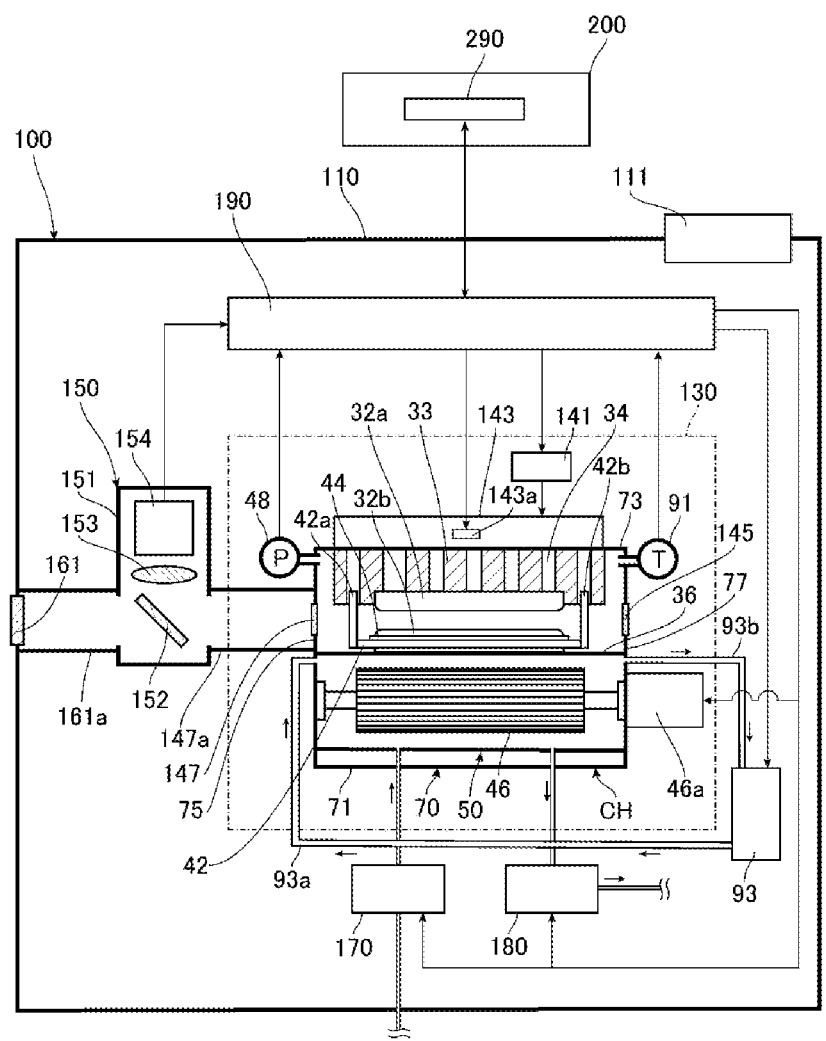
FIG. 4 is a schematic view showing a schematic configuration example of the entire gas laser device of an embodiment.
Figure 5:
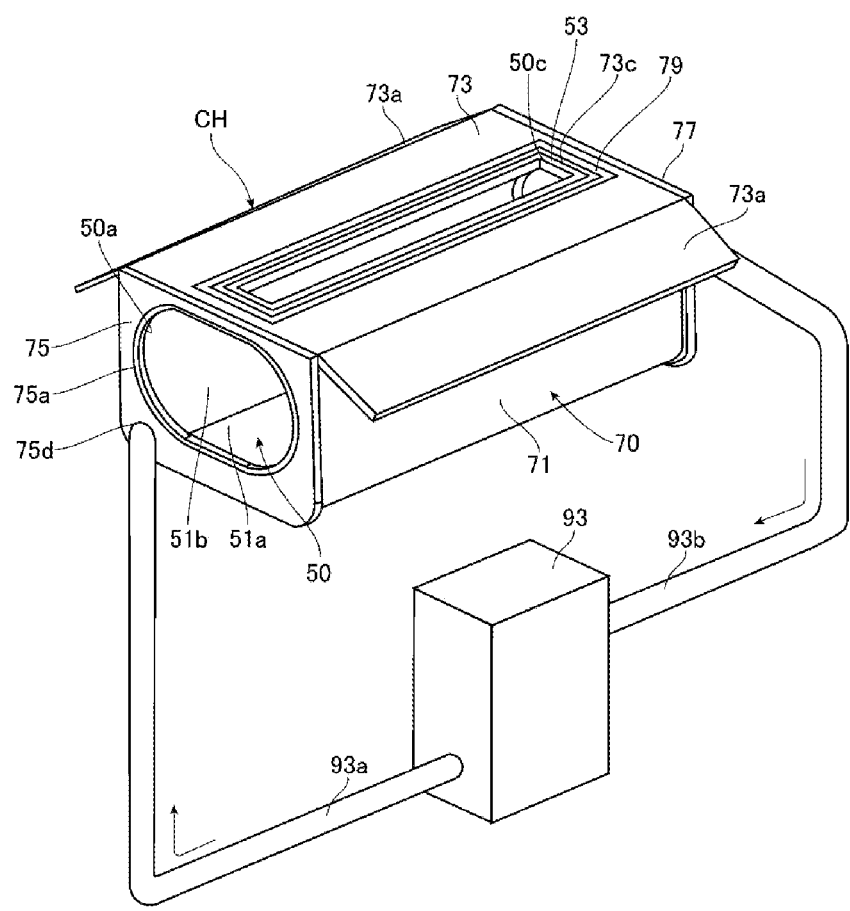
FIG. 5 is a perspective view showing an outer housing surrounding an inner housing and a temperature adjuster.
Figure 6:
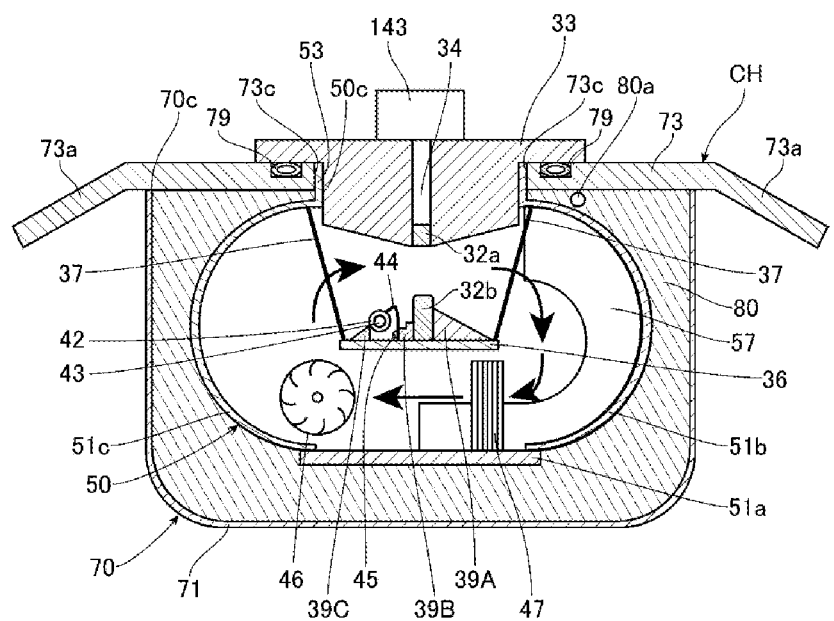
FIG. 6 is a sectional view, perpendicular to the travel direction of laser light, of a chamber device shown in FIG. 4.

FIG. 4 is a schematic view showing a schematic configuration example of the entire gas laser device 100 of the present embodiment. In FIG. 4, the internal configuration of the chamber device CH is shown as viewed from a direction substantially perpendicular to the travel direction of the laser light. FIG. 5 is a perspective view showing an outer housing 70 surrounding an inner housing 50 in the chamber device CH and a temperature adjuster 93. FIG. 6 is a sectional view, perpendicular to the travel direction of the laser light, of the chamber device CH shown in FIG. 4. In FIG. 6, as in the comparative example, the flow of the laser gas is indicated by thick arrows.

In the chamber device CH of the present embodiment, the configuration of the housing of the chamber device CH is different from the configuration of the housing 30 of the comparative example. The chamber device CH of the present embodiment includes the cylindrical inner housing 50, the outer housing 70 surrounding the inner housing 50 from the outside, partition walls 80 arranged in a gap between the inner housing 50 and the outer housing 70 at a lateral side of the travel direction of the laser light, a temperature sensor 91, and the temperature adjuster 93 as a main configuration.

The inner housing 50 includes the internal space in which light is generated by excitation of the laser gas, similarly to the housing 30 of the comparative example. Similarly to the housing 30 of the comparative example, the electrodes 32a, 32b, the insulating portion 33, the electrode holder portion 36, the guides 39A, 39B, 39C, the dielectric pipe 42, the inner electrode 43, the outer electrode 44, the cross flow fan 46, the heat exchanger 47, and the pressure sensor 48 are arranged at the internal space. The pipes of the laser gas supply device 170 and the laser gas exhaust device 180 each penetrate the outer housing 70 and communicate with the internal space of the inner housing 50. The longitudinal direction of the inner housing 50 is along the travel direction of the laser light at the internal space of the inner housing 50, and the laser light passes through the openings 50a, 50b which are passage ports at both ends of the cylindrical inner housing 50. The inner housing 50 as described above surrounds the periphery of the laser light traveling through the internal space of the inner housing 50.

Figure 7:
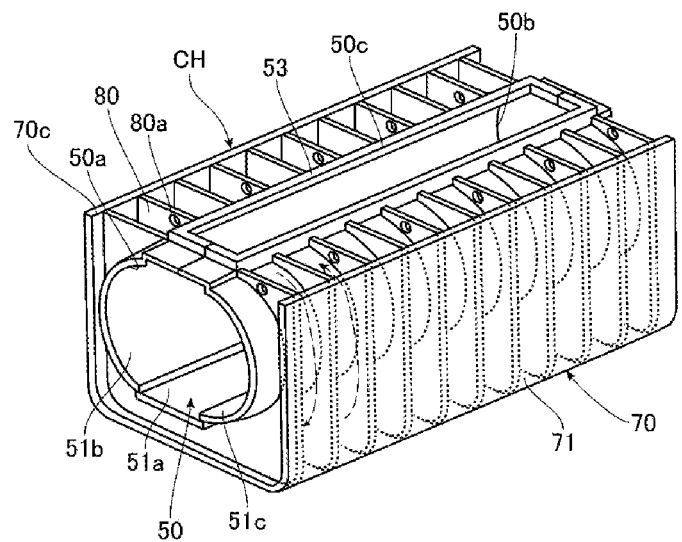
FIG. 7 is a perspective view showing an outer main body portion surrounding the inner housing and partition walls.

FIG. 7 is a perspective view showing an outer main body portion 71 of the outer housing 70 surrounding the inner housing 50 and the partition walls 80. In FIG. 7, parts of the inner housing 50 and the partition walls 80 surrounded by the outer main body portion 71 is indicated by broken lines.

As shown in FIGS. 6 and 7, the inner housing 50 includes a rectangular bottom plate 51a that is long in the longitudinal direction of the inner housing 50 and a pair of curved plates 51b, 51c each having a semicircular shape as a main configuration. The curved plates 51b, 51c have the same size. When the bottom plate 51a and the curved plates 51b, 51c are viewed along the longitudinal direction of the inner housing 50, the curved plates 51b, 51c are arranged symmetrically with respect to the bottom plate 51a, and are curved to bulge in directions away from each other. In the width direction of the bottom plate 51a, the outer peripheral surface of one end of the curved plate 51b is fixed to the inner surface of one end of the bottom plate 51a, and the outer peripheral surface of one end of the curved plate 51c is fixed to the inner surface of the other end of the bottom plate 51a by brazing. In brazing, the curved plates 51b, 51c are brazed over the entire part in contact with the bottom plate 51a. As a result, leakage of the laser gas from the fixed portion to the outside of the inner housing 50 is suppressed. Further, a part of the other end of each of the curved plates 51b, 51c is bent toward the outside of the inner housing 50 in a direction substantially perpendicular to the bottom plate 51a. The bent other ends are fixed by brazing as described above, and a frame-shaped protrusion 53 is provided. The frame-shaped protrusion 53 has a rectangular shape that is long in the longitudinal direction of the inner housing 50, and an opening 50c is provided inside the frame-shaped protrusion 53. The opening 50c has a rectangular shape long in the longitudinal direction of the inner housing 50, and is blocked by the insulating portion 33. On the outer side of the protrusion 53 in the longitudinal direction of the inner housing 50, the remaining part of the other end of each bent curved plate 51b, 51c is bent to face the bottom plate 51a, and the remaining part is fixed to each other by brazing.

The plate thickness of the bottom plate 51a is thicker than the plate thickness of the curved plates 51b, 51c which are plates other than the bottom plate 51a in the inner housing 50. For example, the plate thickness of the bottom plate 51a is 5 mm or more and 7 mm or less, and the plate thickness of the curved plates 51b, 51c is 1 mm or more and 3 mm or less. As described above, the plate thickness of the inner housing 50 is 1 mm or more and 7 mm or less. When the bottom plate 51a which is a flat plate is thicker than the curved plates 51b, 51c, the strength of the bottom plate 51a is higher than when the bottom plate 51a has the same thickness as the curved plates 51b, 51c. Further, when the bottom plate 51a is a flat plate, the volume of the chamber device CH is less than when the bottom plate 51a is a curved plate curved to bulge away from the center axis of the inner housing 50. When the volume is less, the consumption amount of the laser gas from the laser gas supply device 170 is decreased, and the entire gas laser device 100 is downsized. Examples of the material of the inner housing 50 include nickel alloy, ferritic stainless steel, and duplex stainless steel. For example, the nickel alloy is Monel, and the linear expansion coefficient of Monel is $13.9 \times 10^{-6}$/° C. For example, the ferritic stainless steel is SUS430, and the linear expansion coefficient of SUS430 is $10.4 \times 10^{-6}$/° C. Further, for example, the duplex stainless steel is SUS329J4L, and the linear expansion coefficient of SUS329J4L is $13.0 \times 10^{-6}$/° C.

As shown in FIG. 6, cooling fins 57 are fixed to a part of the inner peripheral surface of the inner housing 50 by brazing. In brazing, the cooling fins 57 are brazed over the entire part in contact with the inner peripheral surface of the inner housing 50. FIG. 6 shows an example in which the cooling fins 57 are fixed to the surface of the bottom plate 51a and the inner peripheral surface of the curved plate 51b. The cooling fins 57 are arranged downstream of the space between the electrode 32a and the electrode 32b in the travel direction of the laser gas circulating through the internal space of the inner housing 50 by the cross flow fan 46. The cooling fins 57 are arranged beside the travel path of the laser light at the internal space of the inner housing 50, and do not block the laser light. Heat at the internal space of the inner housing 50 is discharged to the outside of the inner housing 50 via the cooling fins 57. The cooling fins 57 are not shown in the drawings other than FIG. 6 and FIG. 8 described later.

As shown in FIGS. 5, 6, and 7, the outer housing 70 surrounds the inner housing 50 from the lateral side, the front, and the rear in the travel direction of the laser light. The outer housing 70 described above includes an outer main body portion 71, a cover plate 73, a front plate 75, and a rear plate 77 as a main configuration.

The outer main body portion 71 is a plate that surrounds the inner housing 50 from the lateral side and includes openings 70c on the lateral side. The outer main body portion 71 described above has, for example, a U-shaped cross section, and the outer main body portion 71 is arranged to face the lateral side of each of the bottom plate 51a, the curved plates 51b, 51c, and the protrusion 53 of the inner housing 50. The outer main body portion 71 has substantially the same length as the inner housing 50, and the longitudinal direction of the outer main body portion 71 is along the longitudinal direction of the inner housing 50.

The cover plate 73 is arranged at both ends of the outer main body portion 71 and the openings 70c at both ends, and covers the openings 70c of the outer main body portion 71. An opening 73c in which the protrusion 53 of the inner housing 50 is fitted is continuously formed in the cover plate 73. Further, the cover plate 73 has a continuous groove on the upper surface of the cover plate 73. The groove is provided around the opening 73c and has a rectangular shape long in the longitudinal direction of the inner housing 50. A sealing member 79 for sealing between the cover plate 73 and the insulating portion 33 is arranged in the groove. The sealing member 79 is, for example, a metal seal.

Further, the cover plate 73 includes protruding portions 73a protruding outward beyond the side surfaces of the outer main body portion 71 in a direction perpendicular to the longitudinal direction of the outer main body portion 71. The side surface is a surface of the outer main body portion 71 facing the curved plates 51b, 51c in the width direction of the bottom plate 51a of the inner housing 50. The protruding portions 73a are provided on both end sides of the cover plate 73 in the perpendicular direction. Each of the protruding portions 73a is bent so as to surround the side surface of the outer main body portion 71 with respect to the cover plate 73. In this case, the bending angle of each of the protruding portions 73a is, for example, 25° or more and 35° or less. Further, the length of each of the protruding portions 73a is, for example, 100 mm or more and 150 mm or less. This length is the length from the bent part of the protruding portions 73a to the end farthest from the bent part, and is not the length between the side surface of the outer main body portion 71 and the end. Although FIG. 6 shows an example in which the bent part is located beside the side surface, the bent part may be located on the edge of the side surface.

Here, the in-plane direction of the flat area of the cover plate 73 excluding the protruding portions 73a may be parallel to the in-plane direction of the bottom plate 51a, and the protruding portions 73a may protrude outward beyond the side surfaces of the outer main body portion 71 along the in-plane direction. Alternatively, the protruding portions 73a may be bent toward the side opposite to the side surface of the outer main body portion 71. The length of the protruding portions 73a is shortest in a case of bending toward the side surface of the outer main body portion 71, and becomes longer in the order of a case of bending toward the side surface of the outer main body portion 71, a case of bending toward the side opposite to the side surface of the outer main body portion 71, and a case of protruding along the in-plane direction.

As shown in FIG. 5, the front plate 75 is arranged, in the longitudinal direction of the inner housing 50 and the outer main body portion 71, at the opening 50a at one end side of the inner housing 50 and a peripheral edge portion of the opening 50a and an opening at one end side of the outer housing 70 and a peripheral edge portion of the opening. An opening 75a is continuously formed in the front plate 75. The opening 75a has substantially the same size and shape as the opening 50a of the inner housing 50, and overlaps the opening 50a when the front plate 75 is attached to one end side of the inner housing 50 and one end side of the outer main body portion 71. An output side holder (not shown) that holds the output coupling mirror 147 is attached to the front plate 75. The output side holder is attached to the front plate 75 such that the output coupling mirror 147 faces the opening 50a.

The rear plate 77 is arranged, in the longitudinal direction of the inner housing 50 and the outer main body portion 71, at the opening 50b on the other end side of the inner housing 50 and a peripheral edge portion of the opening and an opening at the other end side of the outer housing and the peripheral edge portion of the opening. An opening (not shown) is continuously formed in the rear plate 77. The opening has substantially the same size and shape as the opening 50b of the inner housing 50, and overlaps the opening when the rear plate 77 is attached to the other end side of the inner housing 50 and the other end side of the outer main body portion 71. A rear side holder (not shown) that holds the rear mirror 145 is attached to the rear plate 77. The rear side holder is attached to the rear plate 77 such that the rear mirror 145 faces the opening 50b of the inner housing 50. Therefore, in the chamber device CH of the present embodiment, the housing 145a may be unnecessary.

Since the partition walls 80 are provided in the outer housing 70, the strength of the outer housing 70 may be set lower than the strength of the inner housing 50. Therefore, the plate thickness of each of the outer main body portion 71, the cover plate 73, the front plate 75, and the rear plate 77 may be thinner than the plate thickness of the inner housing 50. When each plate thickness is thin, the weight of the chamber device CH is decreased than when the each plate thickness is equal to or thicker than the plate thickness of the inner housing 50. The thickness of each of the outer main body portion 71, the cover plate 73, the front plate and the rear plate 77 is, for example, 1 mm or more and 3 mm or less. Similarly to the inner housing 50, examples of the material of the outer main body portion 71, the cover plate 73, the front plate 75, and the rear plate 77 include nickel alloy.

As shown in FIGS. 6 and 7, a plurality of partition walls 80 are provided, and each of the partition walls 80 is a support member that supports the inner housing 50, the outer main body portion 71, and the cover plate 73 excluding the protruding portions 73a. The partition walls 80 are fixed to the outer peripheral surface of the inner housing 50 and the inner peripheral surface of the outer housing 70 by brazing. In brazing, the partition walls 80 are brazed over each of the entire part in contact with the outer peripheral surface of the inner housing 50 and the entire part in contact with the inner peripheral surface of the outer housing 70. The inner peripheral surface of the outer housing 70 is the inner peripheral surface of the outer main body portion 71 and the rear surface of the cover plate 73 excluding the protruding portions 73a.

The partition walls 80 are arranged in parallel at predetermined intervals in the longitudinal direction of the inner housing 50 in a state in which the in-plane direction of the partition walls 80 is arranged along a direction substantially perpendicular to the longitudinal direction of the inner housing 50. Accordingly, a surface of one partition wall 80 among the plurality of partition walls 80 faces the rear surface of the partition wall 80 adjacent to the one partition wall 80, and the adjacent partition wall 80 is arranged with a gap thereto. The partition walls 80 are walls that each partitions a gap between the inner housing 50 and the outer main body portion 71 in a direction perpendicular to the longitudinal direction of the inner housing 50, and partitions the gap in the longitudinal direction of the inner housing 50 into sections of the front to rear. A gap is also provided both between the front plate 75 and the partition wall 80 adjacent to the front plate 75 and between the rear plate 77 and the partition wall 80 adjacent to the rear plate 77. Although FIG. 7 shows an example in which 11 pieces of the partition walls 80 are arranged, at least one partition wall 80 may be arranged.

Figure 8:
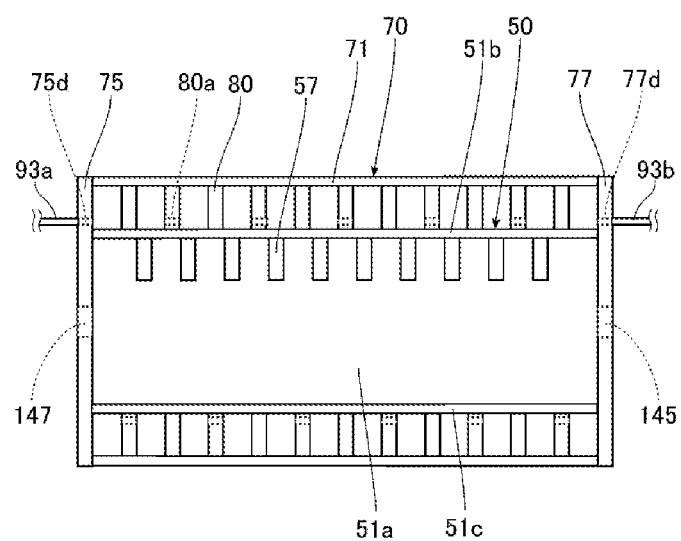
FIG. 8 is a view showing the positional relationship between cooling fins and the partition walls.

FIG. 8 is a view showing the positional relationship between the cooling fins 57 and the partition walls 80. As shown in FIG. 8, a plurality of the cooling fins 57 are arranged on the inner peripheral surface of the inner housing 50. Similarly to the partition walls 80, the cooling fins 57 are arranged in parallel at predetermined intervals in the longitudinal direction of the inner housing 50 in a state in which the in-plane direction of the cooling fins 57 is arranged along a direction substantially perpendicular to the longitudinal direction of the inner housing 50. The partition walls 80 and the cooling fins 57 are alternately arranged along the longitudinal direction of the inner housing 50. Each of the cooling fins 57 is preferably arranged substantially in the middle of the partition walls adjacent to each other in the longitudinal direction of the inner housing 50. Therefore, the length between the adjacent partition walls 80 is substantially the same as the length between the adjacent cooling fins 57. In a case in which the respective lengths therebetween are the same, each of the cooling fins 57 may not be arranged substantially in the middle of the adjacent partition walls 80. Although FIG. 8 shows an example in which the plurality of cooling fins 57 are arranged, one cooling fin 57 may be arranged or no cooling fin 57 may be arranged. Further, the plurality of cooling fins 57 may be arranged along the circumferential direction of the inner housing 50. In this case, the adjacent cooling fins 57 may be arranged apart from each other or may be arranged in contact with each other.

The temperature sensor 91 measures the temperature of the internal space of the inner housing 50. The temperature adjuster 93 shown in FIGS. 4 and 5 is a chiller that supplies a cooling medium to the gap between the inner housing 50 and the outer main body portion 71 by a pump (not shown) of the temperature adjuster 93 and cools the inner housing 50 by the cooling medium. The temperature sensor 91 and the temperature adjuster 93 are electrically connected to the laser processor 190. The temperature sensor 91 outputs a signal indicating the temperature of the internal space of the inner housing 50 to the laser processor 190, and the laser processor 190 outputs a signal indicating the temperature of the cooling medium to the temperature adjuster 93 based on the signal. The cooling medium is a liquid, but may also be a gas. The temperature adjuster 93 adjusts the temperature of the cooling medium based on the signal from the laser processor 190. The set temperature of the cooling medium is, for example, 20° C. or more and 70° C. or less, and the temperature range of the cooling medium flowing through a flow path is preferably ±3° C. of the set temperature.

The temperature adjuster 93 is connected to a pipe 93a connected to an inlet port 75d provided in the front plate and a pipe 93b connected to an outlet port 77d provided in the rear plate 77. The outlet port 77d is hidden and not shown in FIG. 5, but is shown in FIG. 8. The temperature adjuster 93 circulates the cooling medium in the order of the temperature adjuster 93, the pipe 93a, the gap between the inner housing 50 and the outer main body portion 71, the pipe 93b, and the temperature adjuster 93. Here, the temperature adjuster 93 may circulate the cooling medium in the order opposite to the above. The flow path of the cooling medium flowing through the gap between the inner housing 50 and the outer main body portion 71 is formed of a gap between the front plate 75 and the partition wall 80 adjacent to the front plate 75, a gap between the adjacent partition walls and a gap between the rear plate 77 and the partition wall 80 adjacent to the rear plate 77. Each gap between the adjacent partition walls 80 is surrounded by the partition walls 80, the curved plates 51b, 51c, the protrusion 53, the outer main body portion 71, and the cover plate 73.

As shown in FIGS. 6, 7, and 8, the chamber device CH further includes passages 80a, provided at the same positions as the partition walls 80 in the longitudinal direction of the inner housing 50, each causes the cooling medium to flow from one of the adjacent gaps to the other gap adjacent to the one gap. FIGS. 7 and 8 show an example in which the passages 80a are openings provided in the partition walls 80. The passages 80a are a part of the flow path. From the front plate 75 side to the rear plate 77 side, the cooling medium passes through each passage 80a from the gap on the front plate 75 side and flows into the gap on the rear plate 77 side adjacent to the gap on the front plate 75 side. When viewed along the longitudinal direction of the inner housing the passage 80a of one partition wall 80 of the adjacent partition walls 80 is provided at a position not to overlap with the passage 80a of the other partition wall 80. Therefore, at least a part of the passage 80a of the one partition wall 80 is displaced from the passage 80a of the other partition wall 80 in the circumferential direction of the inner housing 50. Further, FIGS. 7 and 8 show an example in which, when viewed along the longitudinal direction of the inner housing 50, the passage 80a of the one partition wall 80 is provided on the side opposite to the passage 80a of the other partition wall 80 with respect to a non-flow area where the cooling medium does not flow in the gap. The non-flow area is an area between, with respect to the curved plates 51b, 51c, both sides of the protrusion 53 in the in-plane direction of the bottom plate 51a. When viewed along the longitudinal direction of the inner housing 50, for example, the cooling medium flows clockwise through the gap on the front plate 75 side in the circumferential direction of the inner housing 50, and flows counterclockwise through the gap on the rear plate 77 side adjacent to the gap on the front plate 75 side in the circumferential direction. Therefore, the cooling medium flows in opposite directions in the respective adjacent gaps. The flow of the cooling medium in each gap is shown by a dashed arrow in FIG. 7. In FIG. 7, for ease of viewing, one flow for each is shown. In the flow path, as described above, the partition walls 80 are brazed over each of the entire part in contact with the outer peripheral surface of the inner housing 50 and the entire part in contact with the inner peripheral surface of the outer housing 70. Therefore, leakage of the cooling medium from the contacting part is suppressed, and the cooling medium flows through the passage 80a from one of the adjacent gaps to the other thereof.

3.2 Effect

The chamber device CH of the present embodiment includes the inner housing 50 including the openings 50a, being the passage ports through which light generated by excitation of the laser gas passes, the outer housing 70 surrounding the inner housing 50 from the lateral side of the travel direction of the light, and the partition walls arranged between the inner housing 50 and the outer housing 70 and fixed to the inner housing 50 and the outer housing 70.

In the chamber device CH, when light is generated as the laser gas is excited, the temperature at the internal space of the inner housing 50 may increase. When the temperature increases, deviation of the temperature distribution at the internal space may occur. Further, when the laser gas is supplied from the laser gas supply device 170 to the internal space of the inner housing 50, the pressure at the internal space increases. The inner housing acts to be deformed due to thermal expansion of the inner housing 50 caused by the temperature increase, the difference in thermal expansion at the internal space of the inner housing 50 caused by the deviation of the temperature distribution, and the increase in the pressure. However, in the chamber device CH of the present embodiment, the deformation of the inner housing 50 can be suppressed by the partition walls 80 fixed to the outer peripheral surface of the inner housing 50 and the outer housing 70 to which the partition walls 80 are fixed. For example, even when the inner housing 50 acts to deform as to expand due to thermal expansion and pressure increase, the expansion of the inner housing 50 can be suppressed by the partition walls 80 and the outer housing 70. Further, even when the inner housing acts to deform as to shrink, the shrinkage of the inner housing 50 can be suppressed by the partition walls 80 and the outer housing 70. When the deformation of the inner housing 50 is suppressed in this manner, the travel direction of the laser light output from the inner housing 50 can be suppressed from changing from a previously assumed travel direction. When the change is suppressed, the travel direction of the light output from the gas laser device 100 toward the exposure apparatus 200 can be suppressed from changing from a previously assumed travel direction. Therefore, a decrease in the reliability of the gas laser device 100 can be suppressed.

Further, in the chamber device CH of the present embodiment, since the partition walls 80 and the outer housing 70 suppress the deformation of the inner housing 50, the plate thickness of the inner housing 50 can be decreased as compared with a case in which the partition walls 80 and the outer housing 70 are not provided. Therefore, even when the partition walls 80 and the outer housing 70 are arranged, the weight of the chamber device CH can be decreased, and the chamber device CH can be easily handled. Further, in order to suppress the deformation of the inner housing 50 in a state in which the partition walls 80 and the outer housing are not provided, it is necessary to increase the rigidity of the inner housing 50. In order to increase the rigidity, it is necessary to increase the thickness of the inner housing 50. In the chamber device CH of the present embodiment, since the partition walls 80 and the outer housing 70 suppress the deformation of the inner housing 50, increase of the thickness of the inner housing 50 can be unnecessary. Further, in the chamber device CH of the present embodiment, the rigidity of the chamber device CH can be increased by the partition walls 80 and the outer housing 70.

Further, in the chamber device CH of the present embodiment, the plurality of partition walls 80 are provided. In this case, the deformation of the inner housing 50 can be suppressed and the rigidity of the chamber device CH can be increased as compared with a case in which the number of the partition walls 80 is one.

Further, in the chamber device CH of the present embodiment, the cover plate 73 includes the protruding portions 73a protruding outward beyond side surfaces of the outer main body portion 71. In a case in which the protruding portions 73a are provided, the rigidity of the cover plate 73 is increased by the amount due to the provided protruding portions 73a, as compared with a case in which the protruding portions 73a are not provided. Therefore, even when the inner housing 50 acts to be deformed, the cover plate 73 can suppress the deformation of the inner housing 50, and the deformation of the cover plate 73 caused by the deformation of the inner housing 50 can also be suppressed. Further, since the rigidity of the cover plate 73 increases as described above, the deformation of the cover plate 73 can be suppressed and the thickness of the cover plate 73 including the protruding portions 73a can be reduced as compared with a case in which the protruding portions 73a are not provided. Therefore, even when the protruding portions 73a are provided, the weight of the chamber device CH can be decreased, and the chamber device CH can be easily handled.

Further, in the chamber device CH of the present embodiment, the protruding portions 73a are bent toward the side surface of the outer main body portion 71 with respect to the cover plate 73. In this case, as compared with a case in which the protruding portions 73a are bent in a direction away from the side surface of the outer main body portion 71, the protruding portions 73a can be shortened if the cover plate 73 is to have the same rigidity in both cases. Therefore, the weight of the chamber device CH may be decreased.

Further, in the chamber device CH of the present embodiment, the cooling fins 57 are arranged on the inner peripheral surface of the inner housing 50, and heat at the internal space of the inner housing 50 is discharged to the outside of the outer housing 70 via the cooling fins 57, the inner housing 50, the partition walls 80, and the outer housing 70. In a case in which the cooling fins 57 are arranged, as compared with a case in which the cooling fins 57 are not arranged, the amount of heat radiation increases, the temperature increase of the inner housing 50 and the deviation of the temperature distribution at the internal space of the inner housing 50 can be suppressed, and the deformation of the inner housing 50 can be suppressed.

Further, in the chamber device CH of the present embodiment, the plurality of cooling fins 57 are provided. In this case, the amount of heat radiation is increased as compared with a case in which the number of the cooling fins 57 is one. When the amount of heat radiation increases, the temperature increase of the inner housing 50 and the deviation of the temperature distribution at the internal space of the inner housing 50 can be further suppressed, and the deformation of the inner housing 50 can be further suppressed.

Further, in the chamber device CH of the present embodiment, the partition walls 80 and the cooling fins 57 are alternately arranged along the travel direction of light. The rigidity of the inner housing 50 between the adjacent partition walls 80 is lower than the rigidity of the inner housing 50 at the part where the partition walls 80 are located because the partition walls 80 are not arranged thereat. When the partition walls 80 and the cooling fins 57 are alternately arranged as described above, the rigidity of the inner housing 50 between the adjacent partition walls 80 is increased because the cooling fins 57 are arranged, as compared with a case in which the partition walls 80 are arranged adjacent to the cooling fins 57 via the inner housing 50. Therefore, the deformation of the inner housing can be suppressed as compared with a case in which the partition walls 80 are arranged adjacent to the cooling fins 57 via the inner housing 50. Here, the cooling fins 57 may be arranged at the same position as the partition walls 80, that is, adjacent to the partition walls 80 via the inner housing 50.

Further, in the chamber device CH of the present embodiment, each of the cooling fins 57 is arranged in the middle of the adjacent partition walls 80. In this case, the change in the strength distribution of the inner housing 50 in the longitudinal direction of the inner housing 50 can be suppressed, and the deformation of the inner housing 50 can be suppressed, as compared with a case in which the cooling fins 57 are arranged to be deviated to either one of the partition walls 80 between the adjacent partition walls 80.

Here, the length between the adjacent partition walls 80 may be different from the length between the adjacent cooling fins 57.

Further, in the chamber device CH of the present embodiment, the adjacent gaps partitioned by the partition walls 80 between the inner housing 50 and the outer housing form the flow path through which the cooling medium flows. When the cooling medium flows through the gaps, the cooling medium comes into contact with the outer peripheral surface of the inner housing 50 and directly cools the inner housing 50. When the cooling medium cools the inner housing 50, the temperature increase of the inner housing 50 can be suppressed, and deformation of the inner housing 50 can be suppressed.

In the chamber device CH of the present embodiment, the flow path is provided on the outside of the inner housing 50. In this case, as compared with a case in which the flow path is provided inside the inner housing 50, the flow path resistance in the circulation path of the laser gas at the internal space of the inner housing 50 is decreased, and the power of the motor 46a of the cross flow fan 46 can be lowered.

Further, when the cooling medium cools the inner housing 50, the heat capacity of the heat exchanger 47 may be reduced or the heat exchanger 47 may be unnecessary as compared with a case in which the cooling medium does not cool the inner housing 50. Therefore, the weight of the chamber device CH may be decreased. Here, even when the cooling fins 57 are arranged, the capacity of the heat exchanger 47 may be reduced, or the heat exchanger 47 may be unnecessary. Further, the temperature adjuster 93 may not be arranged, and the cooling medium may not flow through the gaps.

Further, the chamber device CH of the present embodiment includes the passages 80a, provided at the same positions as the partition walls 80 in the travel direction of the laser light, each causes the cooling medium to flow from one of the adjacent gaps to the other gap. In order for the cooling medium to flow through the respective gaps without the passages 80a provided, it is necessary to connect pipes to the respective gaps. However, by providing the passages 80a, it is unnecessary to connect pipes to the respective gaps, and the weight of the chamber device CH may be decreased. Further, since the inlet port 75d is provided in the front plate 75 and the outlet port 77d is provided in the rear plate 77, the cooling medium can circulate through the flow path as flowing through the respective gaps.

Here, the passages 80a may not be provided in the respective partition walls 80, and pipes may be connected to the respective gaps so that the cooling medium flows through the respective gaps. When the cooling medium circulates as described above, in a process in which the cooling medium flows from the upstream side to the downstream side, the temperature of the cooling medium may increase due to the heat from the inner housing 50, and the cooling medium may not cool the inner housing 50 as expected. However, as compared with a case in which the cooling medium circulates as described above, when the cooling medium flows through the respective gaps, the change in the temperature of the cooling medium can be suppressed, the inner housing 50 can be cooled, and the deformation of the inner housing 50 can be suppressed.

The passage 80a may not be arranged in every partition wall 80. For example, when the passage 80a is not provided in the fifth partition wall 80 from the front plate 75 side, the first to fifth gaps from the front plate 75 side becomes one flow path, and the sixth to twelfth gaps from the front plate 75 side becomes a flow path different from the above flow path. In this case, a pipe may be connected to each flow path, and a cooling medium may flow through each flow path. Further, a plurality of passages 80a may be provided in one partition wall 80.

Further, in the chamber device CH of the present embodiment, when viewed along the travel direction of the light, the passage 80a of one partition wall 80 of the adjacent partition walls 80 is provided at a position not to overlap with the passage 80a of the other partition wall 80. Accordingly, the cooling medium may flow in directions opposite to each other in the adjacent gaps.

Further, in the chamber device CH of the present embodiment, the outer housing 70 includes a plate surrounding a surface of the inner housing 50 including the passage port, and a mirror that faces the passage port and reflects at least a part of the laser light is arranged on the plate. When the passage port is the opening 50a, the plate is the front plate 75 and the mirror is the output coupling mirror 147. The output coupling mirror 147 facing the opening 50a via the output side holder is arranged on the front plate Even when the front plate 75 is arranged in the inner housing 50, the deformation of the inner housing 50 is suppressed as described above, so that the displacement of the front plate 75 including the output coupling mirror 147 can be suppressed. If the front plate 75 including the output coupling mirror 147 is displaced, the travel direction of the laser light transmitted through the output coupling mirror 147 may change from a previously assumed travel direction. However, when the displacement of the front plate is suppressed as described above, the travel direction of the laser light transmitted through the output coupling mirror 147 can be suppressed from changing from the previously assumed travel direction. When the change is suppressed, the travel direction of the light output from the gas laser device 100 toward the exposure apparatus 200 can be suppressed from changing from the previously assumed travel direction. Therefore, a decrease in the reliability of the gas laser device 100 can be suppressed. Further, when the output coupling mirror 147 is arranged on the front plate the damper in the optical path pipe 147a described in the gas laser device 100 of the comparative example may be unnecessary. Therefore, the weight of the chamber device CH may be decreased. Further, when the housing 151 of the monitor module 150 is connected to the front plate 75, the optical path pipe 147a may be unnecessary, and the weight of the chamber device CH may be decreased.

Further, when the passage port is the opening 50b, the plate is the rear plate 77, and the mirror is the rear mirror 145. The rear mirror 145 facing the opening 50b via the rear side holder is arranged on the rear plate 77. In this case as well, similarly to the front plate 75, the displacement of the rear plate 77 including the rear mirror 145 can be suppressed, and a decrease in the reliability of the gas laser device 100 can be suppressed. Further, when the rear mirror 145 is arranged on the rear plate 77, the housing 145a and the damper described in the gas laser device 100 of the comparative example may be unnecessary. Therefore, the weight of the chamber device CH may be decreased.

Further, in the chamber device CH of the present embodiment, the cover plate 73 is provided with the insulating portion 33 and the sealing member 79 that seals between the cover plate 73 and the insulating portion 33. In this case, as compared with a case in which the sealing member 79 is not arranged, impurities can be suppressed from entering from the outside to the inside of the outer housing and the number of times of replacement of the laser gas can be decreased.

Further, in the chamber device CH of the present embodiment, the material of the cover plate 73 is nickel alloy, and the sealing member 79 is a metal seal. The linear expansion coefficient of the alumina ceramics of the insulating portion 33 is, for example, $7.2 \times 10^{-6}/°$ C. Further, for example, the nickel alloy is Monel, and the linear expansion coefficient of Monel and alumina ceramics can be less than that of materials other than Monel, SUS430, and SUS329J4L, so that the relative positional deviation of the insulating portion 33 with respect to the cover plate 73 can be suppressed. When the positional deviation is suppressed, a metal seal having high sealing performance with highly possible leakage of the gas laser due to the positional deviation can be used as the sealing member 79. When the metal seal is used, the reliability of the sealing is further improved as compared with a case in which a sealing member other than the metal seal is used.

In the chamber device CH of the present embodiment, the passage 80a is an opening, but the present invention is not limited thereto. For example, a part of the partition wall 80 may be arranged away from at least one of the inner housing 50 and the outer housing 70, and the passage 80a may be a gap between the part and at least one of the inner housing 50 and the outer housing 70. Examples of the passage as described above include a gap among the other end side of the curved plate 51b, the protrusion 53, the partition wall 80, and the cover plate 73 while a part of the partition wall 80 is arranged away from the other end side of the curved plate 51b and the protrusion 53 on the curved plate 51b side. Here, the gap may be provided on the curved plate 51c side. Alternatively, the passage 80a may be formed by a notch provided in the partition walls 80 and the cover plate 73 that blocks an opening of the notch. The outer housing 70 may surround at least a part of the inner housing 50. The outer housing 70 may surround the inner housing 50 from at least the lateral side of the travel direction of the laser light. The outer main body portion 71 may be longer or shorter than the inner housing 50. The cooling fins 57 may be fixed to the inner peripheral surface of the inner housing 50 by welding, and the partition walls 80 may be fixed to the outer peripheral surface of the inner housing and the inner peripheral surface of the outer housing 70 by welding. The member arranged between the inner housing 50 and the outer housing 70 and fixed to each thereof is not limited to the partition walls 80. The member is simply required to support the inner housing 50, the outer main body portion 71, and the cover plate 73 excluding the protruding portions 73a, and examples of the member include a rod-shaped member that supports the inner housing 50 and the outer main body portion 71 of the outer housing 70. The rod-shaped member may include a plurality of members, and may extend radially from the outer peripheral surface of the inner housing 50 toward the inner peripheral surface of the outer main body portion 71 and the rear surface of the cover plate 73 excluding the protruding portions 73a with respect to the central axis of the inner housing 50 as a spoke. Further, the plurality of partition walls 80 may be arranged along the circumferential direction of the inner housing 50. In this case, the adjacent partition walls may be arranged apart from each other or may be arranged in contact with each other. The cooling fins 57 may be arranged on the outer peripheral surface of the outer housing 70. A temperature sensor may be provided in the flow path of the cooling medium. The temperature sensor measures the temperature of the cooling medium flowing through the flow path. The temperature sensor is electrically connected to the laser processor 190 and outputs a signal indicating the temperature of the cooling medium to the laser processor 190. The laser processor 190 may output, based on the above signal and the signal from the temperature sensor 91, a signal indicating the temperature of the cooling medium to the temperature adjuster 93.

The description above is intended to be illustrative and the present disclosure is not limited thereto. Therefore, it would be obvious to those skilled in the art that various modifications to the embodiment of the present disclosure would be possible without departing from the spirit and the scope of the appended claims. Further, it would be also obvious to those skilled in the art that the embodiment of the present disclosure would be appropriately combined. The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A chamber device comprising:
    an inner housing including a passage port through which light generated by excitation of laser gas at an internal space thereof passes;
    an outer housing surrounding at least a part of the inner housing from a lateral side of a travel direction of the light; and
    a partition wall arranged between the inner housing and the outer housing and fixed to the inner housing and the outer housing.

2. The chamber device according to claim 1,
    wherein the partition wall is formed of a plurality of partition walls, and the partition walls are arranged in parallel at intervals in the travel direction of the light.

3. The chamber device according to claim 1,
    wherein the outer housing includes an outer main body portion surrounding the inner housing from the lateral side and including an opening at the lateral side, and a cover plate covering the opening, and
    the cover plate includes a protruding portion protruding outward beyond a side surface of the outer main body portion.

4. The chamber device according to claim 3,
    wherein the protruding portion is bent toward the side surface.

5. The chamber device according to claim 4,
    wherein a length of the protruding portion from the bent part of the protruding portion to an end of the protruding portion is 100 mm or more and 150 mm or less.

6. The chamber device according to claim 1,
    further comprising a cooling fin arranged on an inner peripheral surface of the inner housing.

7. The chamber device according to claim 6,
    wherein the cooling fin is formed of a plurality of cooling fins, and the cooling fins are arranged in parallel at intervals in the travel direction of the light.

8. The chamber device according to claim 7,
    wherein the partition wall is formed of a plurality of partition walls, and the partition walls are arranged in parallel at intervals in the travel direction of the light, and
    the partition walls and the cooling fins are alternately arranged along the travel direction of the light.

9. The chamber device according to claim 8,
    wherein each of the cooling fins is arranged in the middle of the adjacent partition walls.

10. The chamber device according to claim 1,
    wherein gaps partitioned by the partition wall between the inner housing and the outer housing form a flow path through which a cooling medium flows.

11. The chamber device according to claim 10,
    further comprising a passage, provided at the same position in the travel direction of the light as the partition wall, through which the cooling medium flows from one of the adjacent gaps to the other thereof.

12. The chamber device according to claim 11,
    wherein the partition wall is formed of a plurality of partition walls, and the partition walls are arranged in parallel at intervals in the travel direction of the light, and
    when viewed along the travel direction of the light, the passage at the same position in the travel direction of the light as one of the adjacent partition walls is provided at a position not to overlap with the passage at the same position in the travel direction of the light as the other of the adjacent partition walls.

13. The chamber device according to claim 10,
    further comprising a temperature adjuster configured to adjust a temperature of the cooling medium.

14. The chamber device according to claim 1,
    wherein the outer housing includes a plate surrounding a surface, including the passage port, of the inner housing, and
    the plate is provided with a mirror facing the passage port and configured to reflect at least a part of the light.

15. The chamber device according to claim 1,
    wherein the outer housing includes an outer main body portion surrounding the inner housing from the lateral side and including an opening at the lateral side, and a cover plate covering the opening, and
    the cover plate is provided with an insulating portion, and a sealing member sealing between the cover plate and the insulating portion.

16. The chamber device according to claim 15,
    wherein a material of the cover plate is nickel alloy, and the sealing member is a metal seal.

17. The chamber device according to claim 1,
    wherein a plate thickness of the inner housing is 7 mm or less.

18. The chamber device according to claim 1,
    wherein a plate thickness of the outer housing is 3 mm or less.

19. The chamber device according to claim 1,
    wherein a plate thickness of the outer housing is thinner than a plate thickness of the inner housing.

20. An electronic device manufacturing method, comprising:
    generating laser light using a gas laser device including a chamber device;
    outputting the laser light to an exposure apparatus; and
    exposing a photosensitive substrate to the laser light in the exposure apparatus to manufacture an electronic device,
    the chamber device including:
    an inner housing including a passage port through which light generated by excitation of laser gas at an internal space thereof passes;

an outer housing surrounding at least a part of the inner housing from a lateral side of a travel direction of the light; and a partition wall arranged between the inner housing and the outer housing and fixed to the inner housing and the outer housing.

* * * * *